United States Patent
Ohba et al.

[11] Patent Number: 5,322,985
[45] Date of Patent: Jun. 21, 1994

[54] METHOD FOR BORING SMALL HOLES IN SUBSTRATE MATERIAL

[75] Inventors: Kazuo Ohba, 2-3, Matsubacho 4-chome, Higashimatsuyama-shi, Saitama; Kaori Shima, 768-15, Ohzenji, Asou-ku, Kawasaki-shi, Kanagawa; Akira Ohba, 12-89, Miyado 3-chome, Asaka-shi, Saitama, all of Japan

[73] Assignees: Sakae Electronics Industrial Co., Ltd.; Kazuo Ohba, both of Saitama; Kaori Shima, Kanagawa; Akira Ohba, Saitama, all of Japan

[21] Appl. No.: 41,949

[22] Filed: Apr. 2, 1993

[30] Foreign Application Priority Data
Apr. 7, 1992 [JP] Japan .................................. 4-085654

[51] Int. Cl.$^5$ ................... B23K 9/073; B23K 9/16
[52] U.S. Cl. ................... 219/121.59; 219/121.54; 219/121.44; 219/384; 156/646
[58] Field of Search ............ 219/384, 388, 121.43, 219/121.44, 121.45, 121.59, 68, 121.54; 346/76; 156/643, 345, 646

[56] References Cited

U.S. PATENT DOCUMENTS

| | | | |
|---|---|---|---|
| 3,862,396 | 1/1975 | Machida et al. | 219/384 |
| 4,425,496 | 1/1984 | Le Fur et al. | 219/384 |
| 4,495,399 | 1/1985 | Cann | 219/121 PY |
| 4,534,994 | 8/1985 | Feld et al. | 427/37 |
| 4,635,358 | 1/1987 | Fritz | 29/853 |
| 4,721,550 | 1/1988 | Schumacher, III | 204/15 |
| 4,787,957 | 11/1988 | Barkanic et al. | 156/643 |

Primary Examiner—Mark H. Paschall
Attorney, Agent, or Firm—Flynn, Thiel, Boutell & Tanis

[57] ABSTRACT

A method for boring small holes in a substrate by disposing electrodes on both sides of a substrate to be machined and applying a voltage between the electrodes so as to perform plasma discharge treatment at a pressure of 10 to $2 \times 10^3$ Torrs. In another method, the gap of the two electrodes is set to 0.01 to 50 mm and a peak voltage to 10 V to 50,000 V in accordance with the electrode gap within the range of $\tau_{ON}$ the voltage waveform of 5 μs to 20 seconds. The methods make it possible to quickly and reliably accomplish removal of chips causing clogging, smoothing of the inner walls of the holes and removal of fins in the holes.

2 Claims, 1 Drawing Sheet

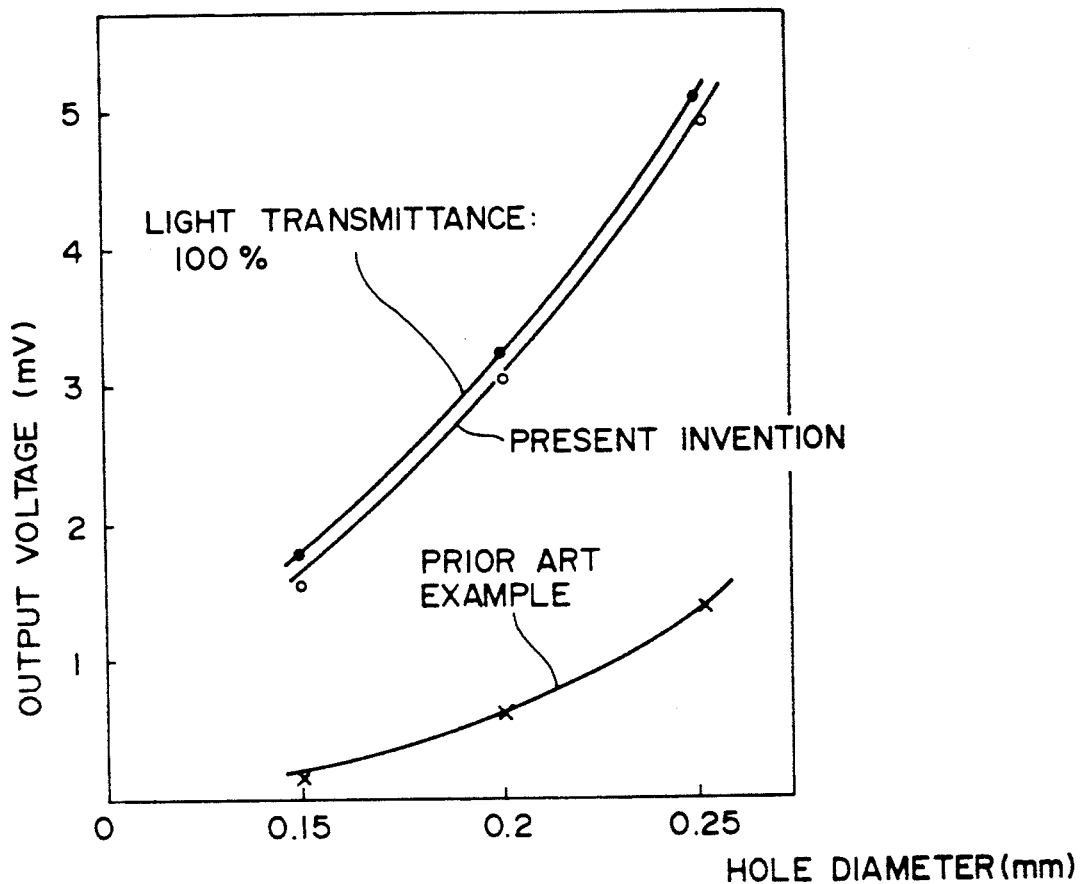

METHOD FOR BORING SMALL HOLES IN SUBSTRATE MATERIAL

BACKGROUND OF THE INVENTION

1. Field of the Invention

This invention relates to a reliable method of carrying out at a high speed treatment for removing chips that cause and a treatment for eliminating inner wall roughening that occur during the boring of small holes in a substrate.

2. Description of the Prior Art

In prior methods, when a boring operation of a double face copper-lined epoxy resin substrate incorporating a glass fiber as a substrate material of an electronic device is carried out, holes having a diameter of greater than 0.3 mm are bored, and the resulting chips are ordinarily removed by a method as ultrasonic washing. Recently, however, wiring is made in a miniature pattern having a high density and a multi-layered structure, and along therewith, diameters of through-holes become as small as about 0.25 mm to about 0.1 mm. Consequently, clogging due to chips, coarsening of inner walls and fins occur frequently due to problems such as wear and breakage of a cutting edge of a drill, and the ultrasonic washing method can no longer remove the chips, inner wall coarsening and the fins.

SUMMARY OF THE INVENTION

Accordingly, the present invention aims at providing a method which can execute quickly and reliably a chip removing treatment inside small holes, secure smoothness of an inner wall surface and remove fins.

The present invention provides a method for boring small holes in a substrate material which comprises disposing electrodes on both sides of a substrate material to be machined, and applying a voltage between the electrodes so that plasma discharge treatment is carried out at a pressure of 10 to $2 \times 10^3$ Torrs and small holes are bored in the substrate material.

The present invention also provides another method for boring small holes in substrate material which comprises disposing electrodes on both sides of a substrate material to be machined with an electrode gap of 0.01 to 50 mm, and performing plasma discharge treatment at a pressure of 10 to $2 \times 10^3$ Torrs within the range of a $\tau_{ON}$ value of 5 μs to 20 s of a voltage waveform while varying the peak voltage within the range of 10 V to 50,000 V in accordance with said electrode gap so as to bore small holes in said substrate material.

In the above methods of the present invention, the boring is preferably carried out in a treating atmosphere of air, a non-oxidizing gas, a reactive gas or a vapor.

In other words, in a small hole boring operation of a substrate material, the inventors have discovered that a plasma discharge treatment is remarkably effective for removing chips, for making an inner surface of a hole smooth and for removing fins, and that the present invention accomplishes the intended objects by suitably selecting and setting an atmosphere, a pressure, a discharge pulse width and a peak voltage.

BRIEF DESCRIPTION OF THE DRAWING

The single FIGURE is a schematic illustration of a graph showing the test results of hole diameters and a voltage of photoelectromotive force corresponding to a mean light transmittance in the present invention in comparison with a prior art example.

DETAILED DESCRIPTION OF THE PREFERRED EMBODIMENTS

When a substrate is made of a material having high heat resistance and high corrosion resistance such as an alumina substrate or a silicon substrate, an aqueous sodium hydroxide or potassium hydroxide is heated to 50° to 60° C. to prepare an alkaline vapor, besides a hydrofluoric acid type gas that has generally been used for etching ceramics. It has been found that when plasma discharge treatment is carried out on substrate holes in such a gas atmosphere at a pressure of 760 Torrs, etching can be made only in the walls of the small holes with a etching efficiency which is three to four times higher than the conventional etching method which uses hydrofluoric acid. It has also been found that in the case of easily inflammable substrates such as a paper substrate, plasma discharge treatment in an Ar or $N_2$ gas atmosphere is effective.

The treating atmosphere is selected suitably from the group consisting of air, a non-oxidizing gas such as Ar, He and $N_2$, a reactive gas such as $CH_4$, $CCl_4$ and $C_2H_2$, and a vapor such as a NaOH vapor.

Control of the pressure is very important. If the pressure is less than 10 Torrs, creeping discharge occurs at portions other than the holes of the substrate material, so that glow discharge develops, plasma discharge efficiency for the intended holes drops and moreover, unnecessary portions, too, are processed by the plasma discharge treatment. If the pressure exceeds $2 \times 10^3$ Torrs, the problem occurs in that the plasma discharge treating apparatus must withstand a higher pressure, and discharge becomes more difficult. The condition of the electrodes is also very important. First, the gap between the two electrodes is preferably within the range of 0.01 to 50 mm. If the gap is less than 0.01 mm, it is not preferable because the thickness of a very large-scale integrated circuit having the smallest thickness as a substrate at present is about 0.005 mm. If the electrode gap exceeds 50 mm, a peak voltage exceeding 50,000 V becomes necessary between the electrodes. However, if the interval between the holes of the substrate material is, for example, 10 mm and such a high voltage is applied to the substrate material, discharge disperses not only to the small holes near the electrodes but also to the remote small holes, so that the plasma discharge effect drops 50%. Therefore, the maximum peak voltage should not exceed 50,000 V, even if any voltage fluctuation occurs. Since the hole interval is below 10 mm at present, the electrode gap is rather determined from the maximum peak voltage of 50,000 V and the maximum gap is 50 mm. If a $\tau_{ON}$ value of the voltage waveform is less than 5 μs, discharge becomes difficult: If it exceeds 20 s, on the other hand, burning/scorching partially occurs in any of the substrate materials, and the objects of the invention cannot be accomplished. If the peak voltage is less than 10 V, plasma discharge has difficulty in occurring and even if it occurs, discharge is a single-shot discharge and is extremely unstable. Therefore, efficiency of the treatment is low. If the peak voltage exceeds 50,000 V, discharge disperses to a large number of small holes, so that not only does discharge efficiency drops but also a problem occurs with safety of the apparatus.

EXAMPLE

Small Holes having diameters of 0.25 mm, 0.2 mm and 0.15 mm were bored with hole gaps of 5 mm by an NC drilling machine in the entire surface of each of resin substrates each having a thickness of 0.8 mm, a length of 20 cm and a width of 30 cm, respectively. The total number of holes was 2,300. During step machining, clogging due to chips became remarkable from 1,390th hole in the case of drilling the small holes having a diameter of 0.25 mm. Clogging due to chips became remarkable from 680th hole in the case of drilling the small holes having a diameter of 0.2 mm and from 430th hole in the case of drilling the small holes having a diameter of 0.15 mm, and coarsening of the inner wall of the holes as well as fins occurred mostly.

Plasma discharge treatment was carried out in air on the substrate having the holes of 0.25 mm at 760 Torrs, with the electrode gap of 10 mm, the $\tau_{ON}$ value of 10 ms and the peak voltage of 11,000 V. The treatment was conducted on 2,300 holes for 2 minutes by moving the discharge electrodes under numerical control. As a result, chips hardly existed inside the holes, the inner walls of the holes were smooth because protrusion of the glass fibers, turn-over and protrusion of the resin resulting from the plasma discharge were eliminated by melt-oxidation, and fins hardly existed.

Similarly, plasma discharge treatment was carried out on the substrates having the holes of 0.2 mm and 0.15 mm, respectively, at an electrode gap of 8 mm and a peak voltage of 9,000 V for the former and at an electrode gap of 6 mm and a peak voltage of 6,000 V, for the latter.

The FIGURE is a diagram showing removal ratios of the chips inside the holes in terms of output voltages corresponding to the quantities of light transmitting through the substrate holes by the use of a CdS photodetector. The ordinate represents the voltage of photo-electromotive force which proportionally corresponds to the mean light transmittance of 2,300 holes. In the case of the holes having the 0.25 mm diameter, an output voltage would be 5 mV if boring was perfectly made, but in accordance with the plasma discharge treating method, the output voltage was 4.9 mV at a light transmittance of 98%. In contrast, according to the conventional method using ultrasonic treatment, the output voltage was 1.4 mV and the transmission was only 28%.

When the hole diameter was 0.15 mm, the light transmittance was 89% in the case of the plasma discharge treatment, but it was only 11% according to the conventional method. Further, in the case of the hole diameter of 0.15 mm, the light transmittance increased and the transmission factor reached 97% when $\tau_{ON}$ was set to 1 ms, a peak voltage was 8,000 V and an electrode gap was 5 mm. When $\tau_{ON}$ was set to 10 μs, the transmission reached 99.9%.

Accordingly, the inner wall treatment of the small holes could be carried out at a high speed and moreover, reliably, by carrying out the plasma discharge treatment under the optimum condition for the substrate by changing the pulse $\tau_{ON}$, the peak voltage and the electrode gap in accordance with the material of the substrate to be machined and with the diameters of the holes.

The method of the present invention can quickly and reliably remove the chips that cause clogging during the boring of small holes in a substrate, obtain smoothness of the inner wall of the holes and remove the fins.

What is claimed is:

1. A method of finishing small holes in a substrate material which comprises: boring small holes in said substrate material; disposing electrodes on opposite sides of said substrate material at an electrode gap of 0.01 to 50 mm; applying a voltage between said electrodes such that a plasma is generated; and performing plasma discharge treatment on said substrate material at a pressure of 10 to $2 \times 10^3$ Torrs and within the range of a $\tau_{ON}$ value of 5 μs to 20 s of a voltage waveform, while varying the peak voltage within the range of 10 V to 50,000 V in accordance with said electrode gap, to smooth and remove debris from inner walls of said small holes produced during the step of boring.

2. A method of finishing small holes in a substrate material according to claim 1 wherein a treating atmosphere is one of air, a non-oxidizing gas, a reactive gas and vapor.

* * * * *